(12) United States Patent
Kwon

(10) Patent No.: US 10,361,662 B2
(45) Date of Patent: Jul. 23, 2019

(54) LOW NOISE AMPLIFIER INCLUDING CURRENT BLEEDING CIRCUIT

(71) Applicant: KNU-Industry Cooperation Foundation, Gangwon-do (KR)

(72) Inventor: Ku Duck Kwon, Seoul (KR)

(73) Assignee: KNU-INDUSTRY COOPERATION FOUNDATION (KR)

(*) Notice: Subject to any disclaimer, the term of this patent is extended or adjusted under 35 U.S.C. 154(b) by 0 days.

(21) Appl. No.: 15/718,585

(22) Filed: Sep. 28, 2017

(65) Prior Publication Data

US 2018/0316314 A1    Nov. 1, 2018

(30) Foreign Application Priority Data

Apr. 26, 2017  (KR) .................. 10-2017-0053483

(51) Int. Cl.
  *H03F 1/26* (2006.01)
  *H03F 3/193* (2006.01)
  *H03F 1/22* (2006.01)
  *H03F 3/45* (2006.01)
(52) U.S. Cl.
  CPC .............. *H03F 1/26* (2013.01); *H03F 1/223* (2013.01); *H03F 3/193* (2013.01); *H03F 2200/294* (2013.01); *H03F 2200/451* (2013.01); *H03F 2200/72* (2013.01); *H03F 2200/75* (2013.01)
(58) Field of Classification Search
  USPC .................................. 330/252–261, 301, 311
  See application file for complete search history.

(56) References Cited

U.S. PATENT DOCUMENTS 7,760,028 B2 *  7/2010  Sanduleanu .............. H03F 1/22
                                              330/301

FOREIGN PATENT DOCUMENTS

KR    100904669 B1    6/2009
KR    101143547 B1    5/2012

OTHER PUBLICATIONS

Cruz, Hugo et al. "A 1.3 mW Low-IF, Current-Reuse, and Current-Bleeding RF Front-End for the MICS Band With Sensitivity of—97 dBm." IEEE Transactions on Circuits and Systems-I: Regular Papers, vol. 62, No. 6, Jun. 2015, pp. 1627-1636.
Park, Ji-Ye, "Flicker Noise Improved CMOS Mixer Using a Feedback Current Bleeding Technique", The Graduate School of Hanyang University, Feb. 2016, 47 pages.

* cited by examiner

*Primary Examiner* — Hieu P Nguyen
(74) *Attorney, Agent, or Firm* — Dorsey & Whitney, LLP

(57) ABSTRACT

Disclosed is a low noise amplifier including a current bleeding circuit. The low noise amplifier includes a common gate amplifier, a common source amplifier of which a gate is connected to a source of the common gate amplifier, a symmetric load connected to an output end of the common gate amplifier and an output end of the common source amplifier, and a current bleeding circuit of which one end is connected to the output end of the common source amplifier and another end is connected to the symmetric load, and including an active element and a load corresponding to the symmetric load.

11 Claims, 5 Drawing Sheets

LOW NOISE AMPLIFIER INCLUDING CURRENT BLEEDING CIRCUIT

CROSS-REFERENCE TO RELATED APPLICATION(S)

This application claims the priority benefit of Korean Patent Application No. 10-2017-0053483 filed on 26 Apr. 2017 in the Korean Intellectual Property Office, the disclosure of which is incorporated herein by reference for all purposes.

BACKGROUND

1. Field

One or more example embodiments relate to a low noise amplifier (LNA) including a current bleeding circuit.

2. Description of Related Art

With the recent development of mobile communication systems, communication devices including, for example, mobile phones and portable information terminals, are rapidly spreading. In addition, a frequency used for communication ranges widely, for example, from 800 megahertz (MHz) to 1 gigahertz (GHz), and 1.5 GHz to 5 GHz, and thus systems for transmitting and receiving signals in different frequency bands are being provided.

A receiver included in a communication device may be provided in various devices including, for example, a digital television (TV), a broadcast service system, a personal digital assistant (PDA), a laptop computer, a desktop computer, a digital multimedia player, a portable or handheld game console, a video game console, a digital camera, a digital recording device, a cellular or satellite wireless phone, a radio-frequency identification (RFID), and a smartphone.

An existing low noise amplifier (LNA) included in such a receiver may include, for example, a common-gate LNA, a resistive feedback LNA, an inductively degenerated common-source LNA, and a common-gate (CG) common-source (CS) balun LNA.

The CG-CS balun LNA may have a mismatch between a gain and a phase and also have noise, and thus may not be effective in terms of a noise factor (NF).

SUMMARY

An aspect provides technology for increasing a degeneration effect by using a current bleeding circuit in a low noise amplifier (LNA).

Another aspect also provides technology for removing noise by using a current bleeding circuit in an LNA.

According to an aspect, there is provided an LNA including a common gate amplifier, a common source amplifier of which a gate is connected to a source of the common gate amplifier, a symmetric load connected to an output end of the common gate amplifier and an output end of the common source amplifier, and a current bleeding circuit of which one end is connected to the output end of the common source amplifier and another end is connected to the symmetric load, and including an active element and a load corresponding to the symmetric load.

The LNA may further include a first transistor connecting the common gate amplifier and the symmetric load by being disposed therebetween.

The LNA may further include a second transistor connecting the common source amplifier and the symmetric load by being disposed therebetween.

The load corresponding to the symmetric load may be embodied as at least one of a resistor, an inductor, or a capacitor.

The active element may be embodied as a transistor, and connect the common source amplifier and the load corresponding to the symmetric load by being disposed therebetween.

The symmetric load may include a first load connected to the common gate amplifier, and a second load connected to the common source amplifier.

An impedance of the first load may be equal to an impedance of the second load.

Each of the first load and the second load may be embodied as at least one of a resistor, an inductor, or a capacitor.

An impedance of the load corresponding to the symmetric load may be 1/(N−1) times the impedance of the first load and the second load.

A size ratio of the common gate amplifier to the common source amplifier may be 1:N.

Additional aspects of example embodiments will be set forth in part in the description which follows and, in part, will be apparent from the description, or may be learned by practice of the disclosure.

BRIEF DESCRIPTION OF THE DRAWINGS

These and/or other aspects, features, and advantages of the present disclosure will become apparent and more readily appreciated from the following description of example embodiments, taken in conjunction with the accompanying drawings of which.

DETAILED DESCRIPTION

Figure 1:
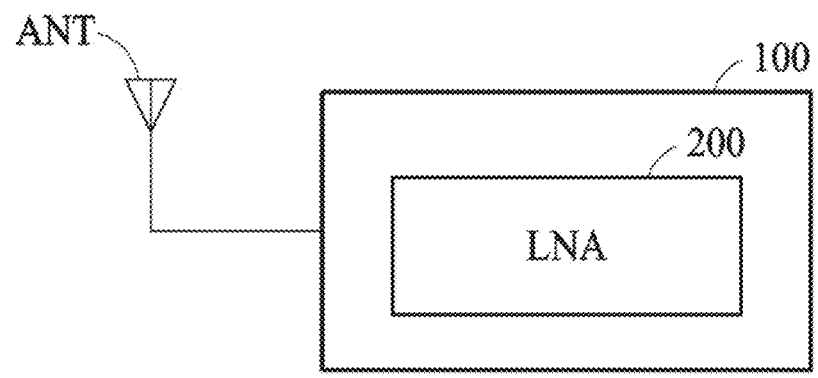
FIG. 1 is a diagram illustrating a communication device according to an example embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Terms such as first, second, A, B, (a), (b), and the like may be used herein to describe components. Each of these terminologies is not used to define an essence, order, or sequence of a corresponding component but used merely to distinguish the corresponding component from other component(s). For example, a first component may be referred to as a second component, and similarly the second component may also be referred to as the first component.

It should be noted that if it is described in the specification that one component is "connected," "coupled," or "joined" to another component, a third component may be "connected," "coupled," and "joined" between the first and second components, although the first component may be directly connected, coupled or joined to the second component. In addition, it should be noted that if it is described in the specification that one component is "directly connected" or "directly joined" to another component, a third component may not be present therebetween. Likewise, expressions, for example, "between" and "immediately between" and "adjacent to" and "immediately adjacent to" may also be construed as described in the foregoing.

The terminology used herein is for the purpose of describing particular embodiments only and is not intended to be limiting. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, operations, elements, and/or components, but do not preclude the presence or addition of one or more other features, integers, operations, elements, components, and/or groups thereof.

Unless otherwise defined, all terms, including technical and scientific terms, used herein have the same meaning as commonly understood by one of ordinary skill in the art to which this disclosure pertains based on an understanding of the present disclosure. Terms, such as those defined in commonly used dictionaries, are to be interpreted as having a meaning that is consistent with their meaning in the context of the relevant art and the present disclosure, and are not to be interpreted in an idealized or overly formal sense unless expressly so defined herein.

Hereinafter, some example embodiments will be described in detail with reference to the accompanying drawings. Regarding the reference numerals assigned to the elements in the drawings, it should be noted that the same elements will be designated by the same reference numerals, wherever possible, even though they are shown in different drawings.

FIG. 1 is a diagram illustrating a communication device 10 according to an example embodiment.

Referring to FIG. 1, the communication device 10 includes an antenna (ANT) and a receiver 100.

The communication device 100 may be a low-power mobile communication device or an ultra-low latency communication device that may perform communication in a wireless communication environment. For example, the communication device 10 may be embodied in, for example, third generation partnership project (3GPP), long-term evolution (LTE), LTE-advanced (LTE-A), 3GPP2, and world interoperability for microwave access (WiMAX).

The communication device 10 may be embodied as a portable electronic device. The portable electronic device may be embodied as, for example, a laptop computer, a mobile phone, a smartphone, a tablet personal computer (PC), a mobile Internet device (MID), a personal digital assistant (PDA), an enterprise digital assistant (EDA), a digital still camera, a digital video camera, a portable multimedia player (PMP), a personal or portable navigation device (PND), a handheld game console, an e-book, a smart device, a smart watch, and a smart band.

The communication device 10 including the receiver 100 having a broadband characteristic may be used in a television (TV) tuner, a software-defined radio (SDR), a cognitive radio, and the like.

The receiver 100 may receive a radio-frequency (RF) signal through the ANT. The ANT may receive the RF signal and transfer the received RF signal to the receiver 100. The RF signal may be a high-frequency signal used for wireless communication. The receiver 100 may perform an overall operation to receive the RF signal.

In addition, the receiver 100 may generate a baseband signal based on the RF signal, and transmit the baseband signal to another circuit, for example, an analog-to-digital converter (ADC) and a modem circuit, that is included in the communication device 10 and used for communication.

The receiver 100 may convert and amplify a single-ended signal to a differential signal. For example, the receiver 100 may use a low noise amplifier (LNA) 200.

The LNA 200 may be a balun LNA. That is, the LNA 200 may function as a balun configured to convert the single-ended signal to the differential signal, and simultaneously function as an LNA configured to amplify a signal received through an ANT at a receiving end of an RF communication system while minimizing an amplification of noise.

The receiver 100 may increase a degeneration effect by using the LNA 200, and also improve a noise characteristic, or a noise figure (NF). In addition, using the LNA 200, the receiver 100 may reduce a mismatch between a gain and a phase, and improve a balance characteristic.

The LNA 200 may include a current bleeding circuit. The current bleeding circuit may include an active element and a passive element.

Figure 2:
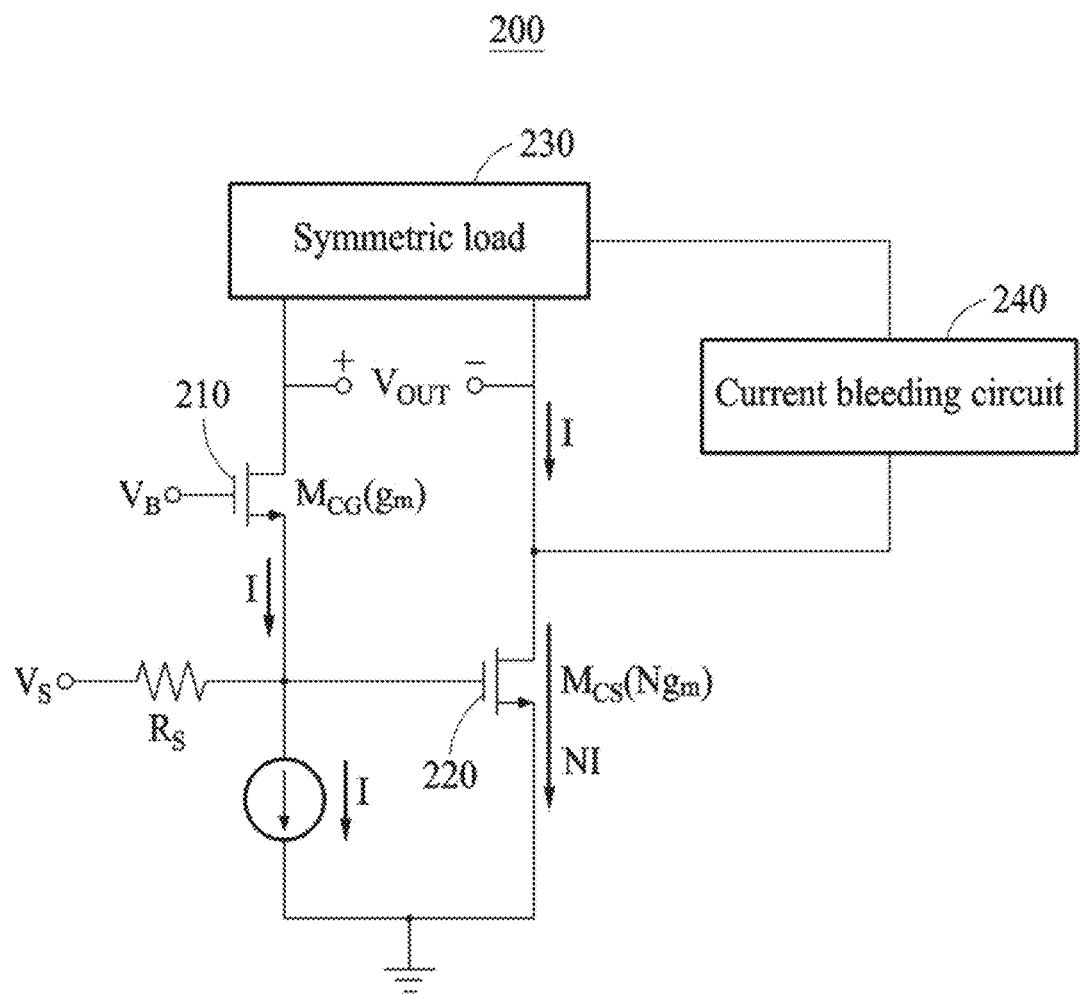
FIG. 2 is a diagram illustrating an example structure of a low noise amplifier (LNA) illustrated in FIG. 1.
Figure 3:
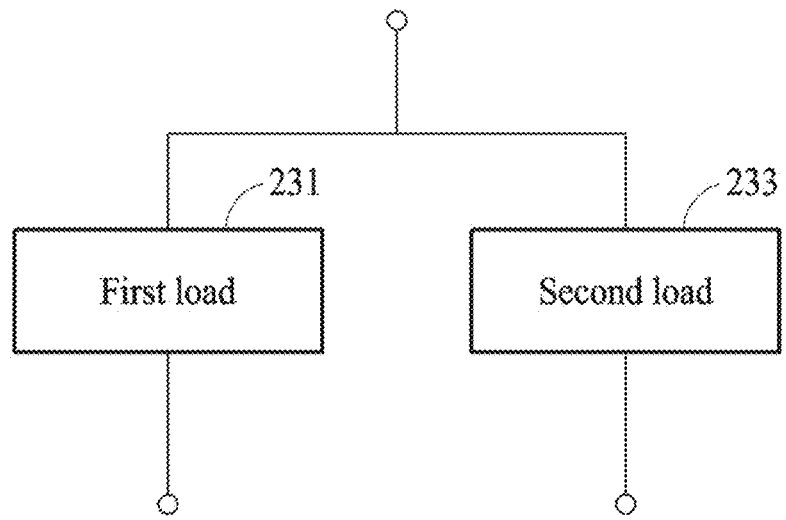
FIG. 3 is a diagram illustrating an example of a symmetric load illustrated in FIG. 2.
Figure 4:
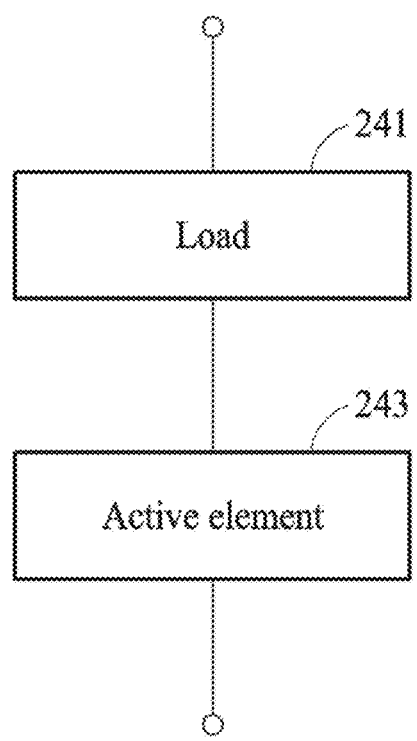
FIG. 4 is a diagram illustrating an example of a current bleeding circuit illustrated in FIG. 2.

FIG. 2 is a diagram illustrating an example of a structure of the LNA 200 illustrated in FIG. 1. FIG. 3 is a diagram illustrating an example of a symmetric load illustrated in FIG. 2. FIG. 4 is a diagram illustrating an example of a current bleeding circuit illustrated in FIG. 2.

Referring to FIG. 2, the LNA 200 includes a common gate amplifier 210, a common source amplifier 220, a symmetric load 230, and a current bleeding circuit 240.

The common gate amplifier 210 may be connected in a common gate type, and receive a single-ended signal as an input. The common gate amplifier 210 may amplify the input single-ended signal to output a signal included in a differential signal.

The common gate amplifier 210 may be embodied as a transistor. For example, the common gate amplifier 210 may receive the single-ended signal through a source, and output the signal included in the differential signal through a drain.

The common source amplifier 220 may be connected in a common source type, and receive a single-ended signal as an input. The common source amplifier 220 may amplify the input single-ended signal to output a signal included in the differential signal. That is, the signal output from the common source amplifier 220 and the signal output from the common gate amplifier 210 may be included in the differential signal.

The common source amplifier 220 may be embodied as a transistor. For example, the common source amplifier 220 may receive the single-ended signal through a gate, and output the signal included in the differential signal through a drain.

A size of the common source amplifier 220 may be N times a size of the common gate amplifier 210. For example, a transconductance Ngm of the common source amplifier 220 may be N times a transconductance gm of the common gate amplifier 210.

The symmetric load 230 may be electrically connected to an output end of the common gate amplifier 210 and an output end of the common source amplifier 220. Here, an electrical connection described herein may indicate a connection including a physical connection and also a connection through which an electrical signal is transferred. Thus, another component may be disposed between two components that are electrically connected.

Referring to FIG. 3, the symmetric load 230 includes a first load 231 and a second load 233. The first load 231 may be electrically connected to the common gate amplifier 210, and the second load 233 may be electrically connected to the common source amplifier 220.

An impedance of the first load 231 may be equal to an impedance of the second load 233. For example, each of the first load 231 and the second load 233 may be embodied as at least one of a resistor, an inductor, or a capacitor.

The current bleeding circuit 240 may distribute a current flowing through the common source amplifier 220. That is, the current bleeding circuit 240 may distribute the current flowing through the common source amplifier 220 to be equal to a current flowing through the common gate amplifier 210.

For example, a magnitude of the current flowing in the common source amplifier 220 may be NI. The current bleeding circuit 240 may distribute a current of (N−1)I of the current of NI to the current bleeding circuit 240 so that a current of I may flow in the symmetric load 230. That is, a magnitude of a current flowing in the first load 231 and the second load 233 may be I, and thus the first load 231 and the second load 233 may be symmetrical to each other.

Although the transconductance Ngm of the common source amplifier 220 is N times the transconductance gm of the common gate amplifier 210, only 1/N of the current flowing through the common source amplifier 220 may flow to the symmetric load 230, and thus a gain at the output end of the common source amplifier 220 and a gain at the output end of the common gate amplifier 210 may be equal.

One end of the current bleeding circuit 240 may be electrically connected to the output end, for example, the drain, of the common source amplifier 220, and the other end of the current bleeding circuit 240 may be electrically connected to the symmetric load 230.

Referring to FIG. 4, the current bleeding circuit 240 includes a load 241 corresponding to the symmetric load 230, and an active element 243. The load 241 corresponding to the symmetric load 230 and the active element 243 may be connected in series or in parallel. An example of a series connection of the load 241 corresponding to the symmetric load 230 and the active element 243 is as illustrated in FIG. 4.

The load 241 corresponding to the symmetric load 230 may be embodied as at least one of a resistor, an inductor, or a capacitor.

Figure 5:
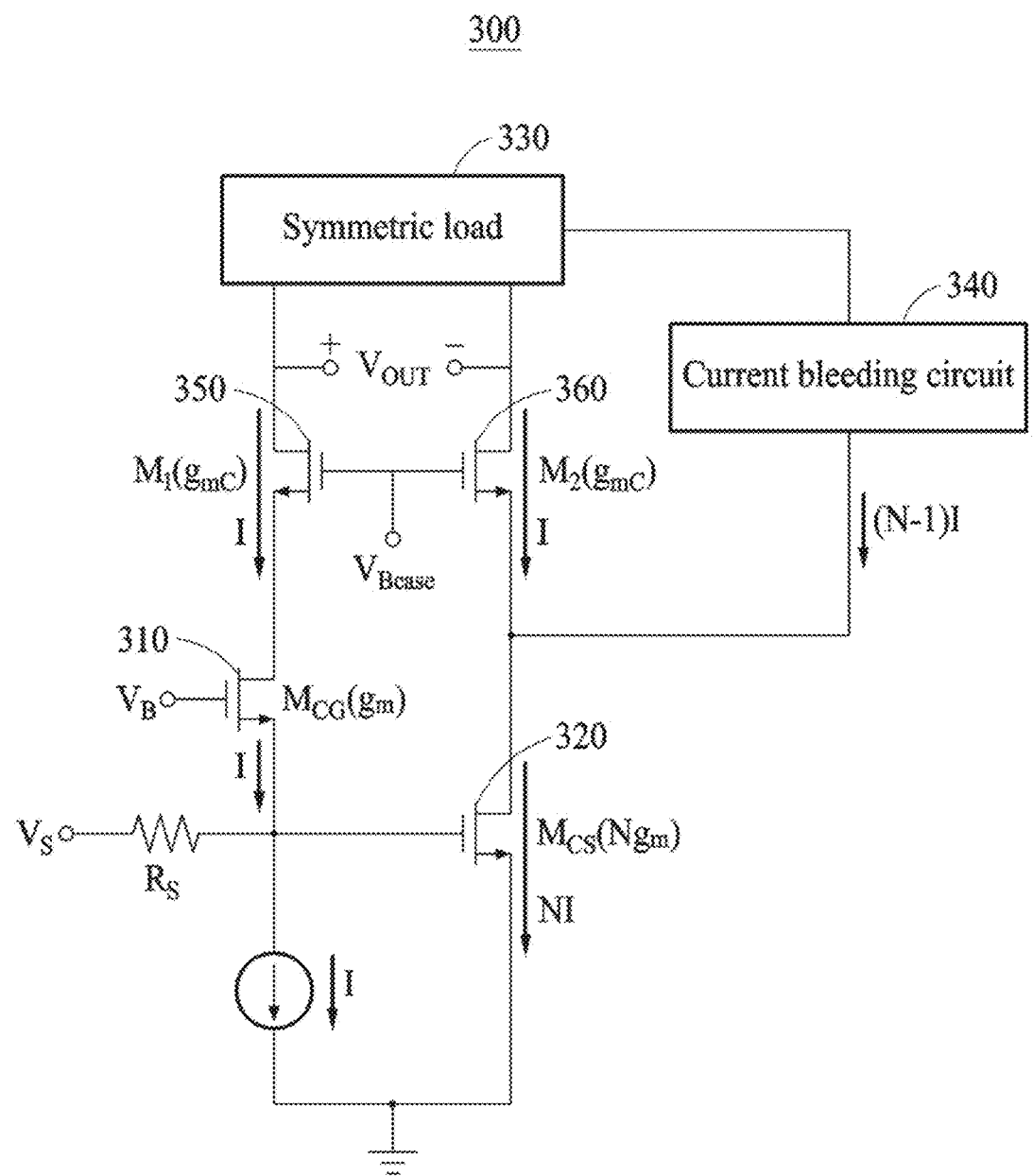
FIG. 5 is a diagram illustrating another example structure of the LNA illustrated in FIG. 1.

FIG. 5 is a diagram illustrating another example structure of the LNA 200 illustrated in FIG. 1, which is illustrated as an LNA 300 in FIG. 5.

Referring to FIG. 5, the LNA 300 includes a common gate amplifier 310, a common source amplifier 320, a symmetric load 330, a current bleeding circuit 340, a first transistor 350, and a second transistor 360.

Respective configurations and operations of the common gate amplifier 310, the common source amplifier 320, the symmetric load 330, and the current bleeding circuit 340 of the LNA 300 illustrated in FIG. 5 may be substantially identical to respective configurations and operations of the common gate amplifier 210, the common source amplifier 220, the symmetric load 230, and the current bleeding circuit 240 of the LNA 200 illustrated in FIG. 2.

The first transistor 350 may electrically connect the common gate amplifier 310 and the symmetric load 330 by being disposed therebetween. For example, the first transistor 350 may be connected to the common gate amplifier 310 in a form of a cascode.

The second transistor 360 may electrically connect the common source amplifier 320 and the symmetric load 330 by being disposed therebetween. For example, the second transistor 360 may be connected to the common source amplifier 320 in a form of a cascade.

A size of the first transistor 350 may be equal to a size of the second transistor 360. For example, a transconductance gmC of the first transistor 350 may be equal to a transconductance gmC of the second transistor 360. Thus, a current of I may flow in the first transistor 350, and a current of I may flow in the second transistor 360.

The current bleeding circuit 340 may increase a degeneration effect that is shown at a source of the second transistor 360, and remove noise to improve a noise characteristic, for example, an NF.

Hereinafter, an example of the symmetric load 330 being embodied as a resistor, and the current bleeding circuit 340 being embodied as a resistor and a transistor will be described.

Figure 6:
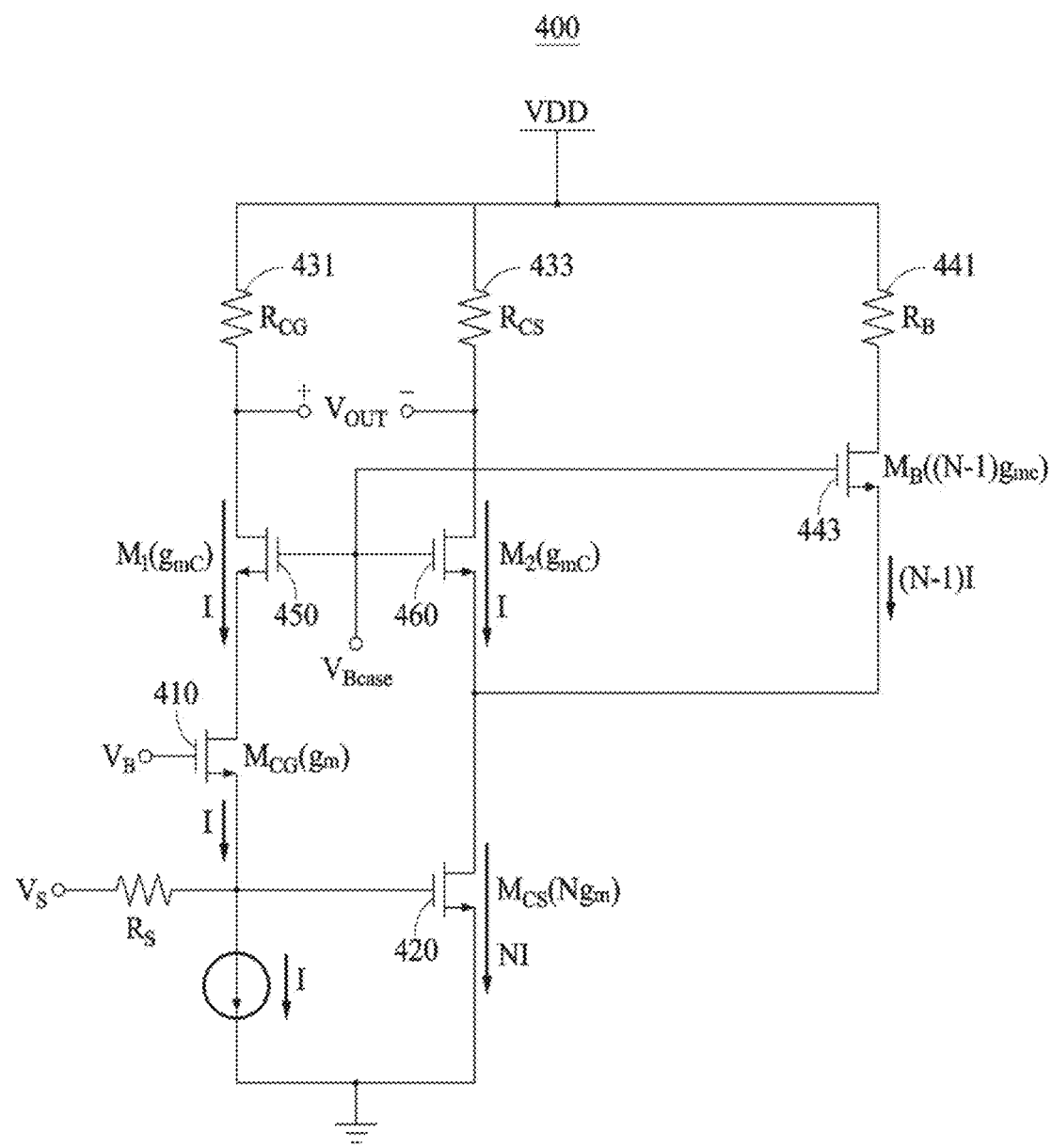
FIG. 6 is a diagram illustrating an example structure of the LNA illustrated in FIG. 5.
Figure 7:
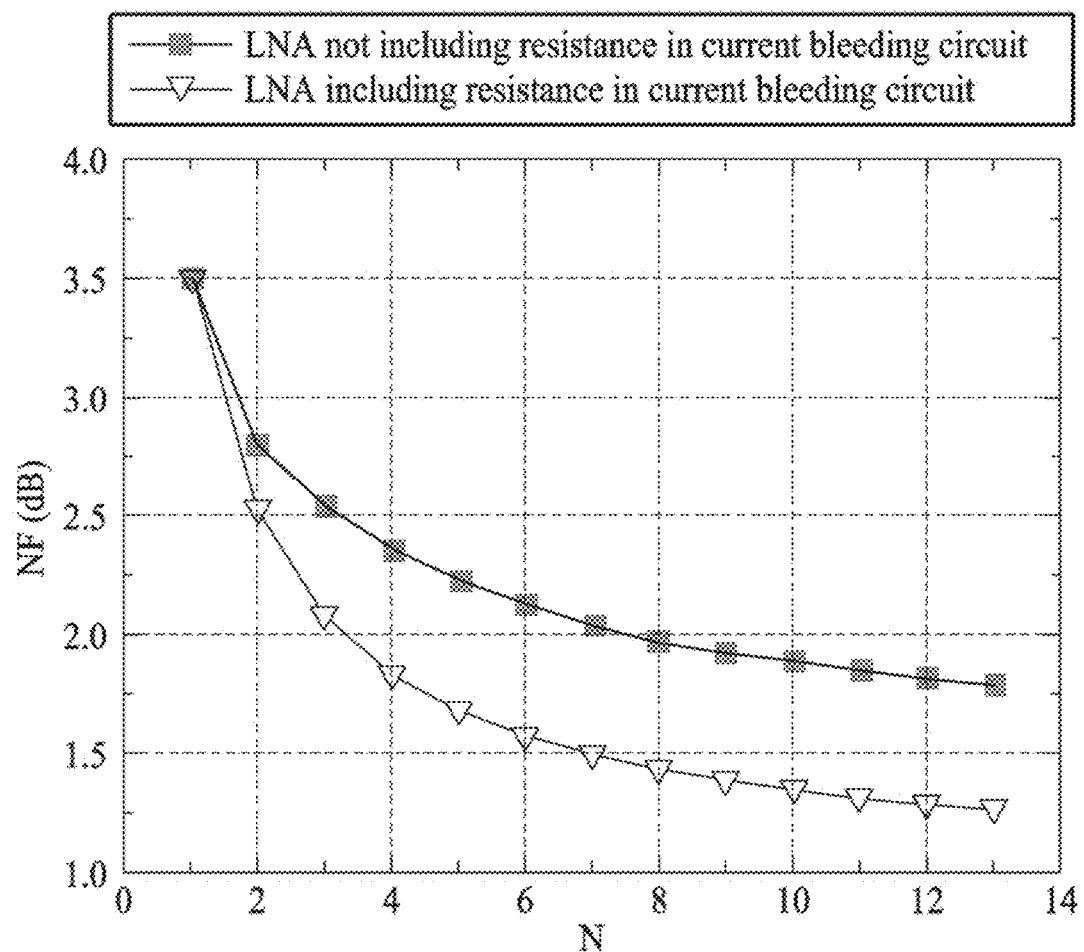
FIG. 7 is a graph illustrating performance of the LNA illustrated in FIG. 6.

FIG. 6 is a diagram illustrating an example structure of the LNA 300 illustrated in FIG. 5, which is illustrated as an LNA 400 in FIG. 6. FIG. 7 is a graph illustrating performance of the LNA 400 illustrated in FIG. 6.

Referring to FIG. 6, the LNA 400 includes a common gate amplifier 410, a common source amplifier 420, a symmetric load including a first load 431 and a second load 433, a current bleeding circuit including a load 441 and an active element 443, a first transistor 450, and a second transistor 460.

Respective configurations and operations of the common gate amplifier 410, the common source amplifier 420, the first transistor 450, and the second transistor 460 of the LNA 400 illustrated in FIG. 6 may be substantially identical to respective configurations and operations of the common gate amplifier 310, the common source amplifier 320, the first transistor 350, and the second transistor 360 of the LNA 300 illustrated in FIG. 5.

The first load 431 and the second load 433 may be embodied as a resistor RCG and a resistor RCS, respectively.

The load 441 corresponding to the symmetric load may be embodied as a resistor RB, and the active element 443 may be embodied as a transistor MB. The active element 443 may be connected to the common source amplifier 420 in a form of a cascode. For example, a source of the active element 443 may be connected to a drain of the common source amplifier 420, and a gate of the active element 443 may be connected to a gate of the first transistor 450 and a gate of the second transistor 460.

Here, a resistance value RU(N−1) of the load 441 corresponding to the symmetric load may be 1/(N−1) times a resistance value RL of the first load 431. Similarly, a resistance value RU(N−1) of the load 441 corresponding to the symmetric load may be 1/(N−1) times a resistance value RL of the second load 433.

A size of the active element 443 may be larger than a size of the second transistor 460 by a factor of (N−1) times. For example, a transconductance (N−1)gmC of the active element 443 may be greater than a transconductance gmC of the second transistor 460 by a factor of (N−1) times. Thus, a current of I may flow in the second transistor 460, and a current of (N−1)I may flow in the active element 443.

The load 441 corresponding to the symmetric load may remove, or reduce considerably, an influence of noise of the second transistor 460 that may occur in an output. Here, the noise may be thermal noise. In response to an absence of the load 441 corresponding to the symmetric load from the current bleeding circuit, a degeneration effect that is shown at a source of the second transistor 460 may be represented by Equation 1 as below.

$$Z_{Degen1} = \frac{r_o}{N} \parallel \frac{1}{N-1}\frac{1}{g_{mC}} \cong \frac{1}{(N-1)g_{mC}} \qquad [\text{Equation 1}]$$

In Equation 1, ZDegen1 denotes the degeneration effect that is shown at the source of the second transistor 460 in the absence of the load 441 corresponding to the symmetric load from the current bleeding circuit, and ro denotes an output impedance of the common gate amplifier 410 and gmC denotes a transconductance of the second transistor 460.

In response to a presence of the load 441 corresponding to the symmetric load in the current bleeding circuit, the degeneration effect that is shown at the source of the second transistor 460 may increase as represented by Equation 2. Thus, the noise may be removed from the second transistor 460, and an NF of the LNA 400 may be improved accordingly.

$$Z_{Degen2} = \frac{r_o}{N} \parallel \frac{1}{N-1}\frac{R_L + r_{oC}}{1 + g_{mC}r_{oC}} \qquad [\text{Equation 2}]$$
$$\cong \frac{1}{N-1}\frac{R_L + r_{oC}}{1 + g_{mC}r_{oC}}$$

In Equation 2, ZDegen2 denotes the degeneration effect that is shown at the source of the second transistor 460 in the presence of the load 441 corresponding to the symmetric load in the current bleeding circuit, and ro denotes an output impedance of the common gate amplifier 410, roC denotes an output impedance of the second transistor 460, and gmC denotes a transconductance of the second transistor 460.

Under a matching condition RS=1/gm, an NF of the second transistor 460 in the absence of the load 441 corresponding to the symmetric load in the current bleeding circuit may be represented by Equation 3 as below.

$$NF_1 \cong 1 + \frac{\gamma}{N} + \frac{\gamma g_{mC}}{g_m}\left(\frac{N-1}{N}\right)^2 \qquad [\text{Equation 3}]$$

In Equation 3, NF1 denotes an NF of the second transistor 460 in the absence of the load 441 corresponding to the symmetric load from the current bleeding circuit, and y denotes an NF coefficient.

Under the matching condition RS=1/gm, an NF of the second transistor 460 in the presence of the load 441 corresponding to the symmetric load in the current bleeding circuit may be improved as represented by Equation 4.

$$NF_2 \cong 1 + \frac{\gamma}{N} + \frac{\gamma g_{mC}}{g_m}\left(\frac{1}{1 + g_{mC}\left(\frac{r_o}{N} \parallel \frac{1}{n-1}\frac{R_L + r_{oC}}{1 + g_{mC}r_{oC}}\right)}\right)^2 \qquad [\text{Equation 4}]$$

In Equation 4, NF2 denotes an NF of the second transistor 460 in the presence of the load 441 corresponding to the symmetric load in the current bleeding circuit.

As described above, performance of an LNA may be as illustrated in FIG. 7 based on a presence and an absence of a load corresponding to a symmetric load in and from a current bleeding circuit. Referring to FIG. 7, the greater a magnitude of N, the smaller noise. As illustrated, an NF may be more desirable in the presence of the load corresponding to the symmetric load in the current bleeding circuit, compared to an example shown in the absence of the load corresponding to the symmetric load from the current bleeding circuit.

The components described in the example embodiments of the present disclosure may be achieved by hardware components including at least one of a digital signal processor (DSP), a processor, a controller, an application specific integrated circuit (ASIC), a programmable logic element such as a field programmable gate array (FPGA), other electronic devices, and combinations thereof. At least some of the functions or the processes described in the example embodiments of the present disclosure may be achieved by software, and the software may be recorded on a recording medium. The components, the functions, and the processes described in the example embodiments of the present disclosure may be achieved by a combination of hardware and software.

The processing device described herein may be implemented using hardware components, software components, and/or a combination thereof. For example, the processing device and the component described herein may be implemented using one or more general-purpose or special purpose computers, such as, for example, a processor, a controller and an arithmetic logic unit (ALU), a digital signal processor, a microcomputer, a field programmable gate array (FPGA), a programmable logic unit (PLU), a microprocessor, or any other device capable of responding to and executing instructions in a defined manner. The processing device may run an operating system (OS) and one or more software applications that run on the OS. The processing device also may access, store, manipulate, process, and create data in response to execution of the software. For purpose of simplicity, the description of a processing device is used as singular; however, one skilled in the art will be appreciated that a processing device may include multiple processing elements and/or multiple types of processing elements. For example, a processing device may include multiple processors or a processor and a controller. In addition, different processing configurations are possible, such as parallel processors.

The methods according to the above-described example embodiments may be recorded in non-transitory computer-readable media including program instructions to implement various operations of the above-described example embodiments. The media may also include, alone or in combination with the program instructions, data files, data structures, and the like. The program instructions recorded on the media may be those specially designed and constructed for the purposes of example embodiments, or they may be of the kind well-known and available to those having skill in the computer software arts. Examples of non-transitory computer-readable media include magnetic media such as hard disks, floppy disks, and magnetic tape; optical media such as CD-ROM discs, DVDs, and/or Blue-ray discs; magneto-optical media such as optical discs; and hardware devices that are specially configured to store and perform program instructions, such as read-only memory (ROM), random access memory (RAM), flash memory (e.g., USB flash drives, memory cards, memory sticks, etc.), and the like. Examples of program instructions include both machine code, such as produced by a compiler, and files containing higher level code that may be executed by the computer using an interpreter. The above-described devices may be configured to act as one or more software modules in order to perform the operations of the above-described example embodiments, or vice versa.

A number of example embodiments have been described above. Nevertheless, it should be understood that various modifications may be made to these example embodiments. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A low noise amplifier comprising
a common gate amplifier;
a common source amplifier of which a gate is connected to a source of the common gate amplifier;
a symmetric load connected to an output end of the common gate amplifier and an output end of the common source amplifier, wherein a first transistor connects the common gate amplifier and the symmetric load by being disposed therebetween, and wherein a second transistor connects the common source amplifier and the symmetric load by being disposed therebetween, and wherein a gate of the first transistor and a gate of the second transistor are coupled at a common node; and
a current bleeding circuit of which one end is directly connected to a source/drain of the common source amplifier and another end is connected to the symmetric load, and including an active element and a load corresponding to the symmetric load.

2. The low noise amplifier of claim 1 further comprising a first transistor connecting the common gate amplifier and the symmetric load by being disposed therebetween.

3. The low noise amplifier of claim 1 further comprising a second transistor connecting the common source amplifier and the symmetric load by being disposed therebetween.

4. The low noise amplifier of claim 1, wherein the load corresponding to the symmetric load is embodied as at least one of a resistor, an inductor, or a capacitor.

5. The low noise amplifier of claim 4, wherein the active element is embodied as a transistor, and connects the common source amplifier and the load corresponding to the symmetric load by being disposed therebetween.

6. The low noise amplifier of claim 1, wherein the symmetric load includes
a first load connected to the common gate amplifier; and
a second load connected to the common source amplifier.

7. The low noise amplifier of claim 6, wherein an impedance of the first load is equal to an impedance of the second load.

8. The low noise amplifier of claim 6, wherein each of the first load and the second load is embodied as at least one of a resistor, an inductor, or a capacitor.

9. The low noise amplifier of claim 7, wherein an impedance of the load corresponding to the symmetric load is $1/(N-1)$ times the impedance of the first load and the second load.

10. The low noise amplifier of claim 1, wherein a size ratio of the common gate amplifier to the common source amplifier is 1:N.

11. The low noise amplifier of claim 1, wherein the active element is embodied as a transistor, of which a gate connects the first transistor and the second transistor at the common node.

* * * * *